(12) United States Patent
Jeon et al.

(10) Patent No.: US 10,679,566 B2
(45) Date of Patent: Jun. 9, 2020

(54) DISPLAY DEVICE

(71) Applicant: SAMSUNG DISPLAY CO., LTD., Yongin-si, Gyeonggi-do (KR)

(72) Inventors: Jae Hyeon Jeon, Yongin-si (KR); Byung Sun Kim, Yongin-si (KR); Ji Hye Kim, Yongin-si (KR); Hui Nam, Yongin-si (KR); Dong Hoon Lee, Yongin-si (KR)

(73) Assignee: Samsung Display Co., Ltd. (KR)

( * ) Notice: Subject to any disclaimer, the term of this patent is extended or adjusted under 35 U.S.C. 154(b) by 173 days.

(21) Appl. No.: 15/843,367

(22) Filed: Dec. 15, 2017

(65) Prior Publication Data

US 2018/0174523 A1 Jun. 21, 2018

(30) Foreign Application Priority Data

Dec. 20, 2016 (KR) .................. 10-2016-0174570

(51) Int. Cl.
*G09G 3/3275* (2016.01)
*H01L 27/32* (2006.01)
(Continued)

(52) U.S. Cl.
CPC ......... *G09G 3/3275* (2013.01); *G09G 3/3258* (2013.01); *G09G 3/3266* (2013.01); *H01L 27/323* (2013.01); *H01L 27/3276* (2013.01); *H01L 51/0097* (2013.01); *G09G 2310/08* (2013.01); *G09G 2320/0233* (2013.01); *G09G 2330/02* (2013.01); *G09G 2380/02* (2013.01);
(Continued)

(58) Field of Classification Search
CPC ....... G09G 2310/08; G09G 2320/0233; G09G 2330/02; G09G 2380/02; G09G 3/3258; G09G 3/3266; G09G 3/3275; H01L 2251/5338; H01L 27/323; H01L 27/3276; H01L 51/0097; Y02E 10/549
See application file for complete search history.

(56) References Cited

U.S. PATENT DOCUMENTS

2008/0218369 A1* 9/2008 Krans .................. A47G 9/1045
340/691.1
2014/0138637 A1* 5/2014 Yang ................... H01L 27/1218
257/40
(Continued)

FOREIGN PATENT DOCUMENTS

| EP | 3223327 A1 | 9/2017 |
|---|---|---|
| KR | 10-2016-0096275 A | 8/2016 |
| KR | 10-2016-0110689 A | 9/2016 |

OTHER PUBLICATIONS

Extended European Search Report, dated May 4, 2018, 9 Pages.

*Primary Examiner* — Tony O Davis
(74) *Attorney, Agent, or Firm* — Innovation Counsel LLP

(57) ABSTRACT

Provided herein may be a display device. The display device may include a substrate, a base layer, a first protrusion and a second protrusion. The substrate may include a pixel area, and a peripheral area surrounding the pixel area. The base layer may be disposed on the pixel area, and include a plurality of island patterns on which respective pixels are provided, and a plurality of bridge patterns coupling the adjacent island patterns to each other, the plurality of island patterns and the plurality of bridge patterns disposed on the first area. The first protrusion and the second protrusion may be provided on the base layer.

27 Claims, 13 Drawing Sheets

(51) Int. Cl.
    *G09G 3/3266*    (2016.01)
    *G09G 3/3258*    (2016.01)
    *H01L 51/00*     (2006.01)
(52) U.S. Cl.
    CPC ..... *H01L 2251/5338* (2013.01); *Y02E 10/549* (2013.01)

(56) References Cited

U.S. PATENT DOCUMENTS

| | | | |
|---|---|---|---|
| 2014/0144480 A1* | 5/2014 | Lee | H01L 31/048 136/244 |
| 2016/0066408 A1* | 3/2016 | Afentakis | H01L 27/14612 257/72 |
| 2016/0190389 A1 | 6/2016 | Lee et al. | |
| 2016/0225314 A1* | 8/2016 | Lee | G09G 3/3233 |
| 2016/0268352 A1* | 9/2016 | Hong | H01L 27/3218 |
| 2016/0293571 A1* | 10/2016 | Yoon | H01L 25/048 |
| 2016/0320878 A1 | 11/2016 | Hong et al. | |

* cited by examiner

DISPLAY DEVICE

CROSS-REFERENCE TO RELATED APPLICATION

The present application claims priority to Korean patent application number 10-2016-0174570 filed on Dec. 20, 2016, the entire disclosure of which is incorporated herein in its entirety by reference.

BACKGROUND

Field

Various embodiments of the present disclosure relate to a display device.

Description of Related Art

Representative examples of display devices include a liquid crystal display (LCD), a plasma display panel (PDP), an organic light emitting diode (OLED) device, a field effect display (FED), and an electrophoretic display device.

OLED devices have self-luminance characteristics and do not need a separate light source unlike that of the LCD, so that the thickness and weight thereof can be reduced compared with that of the LCD. Furthermore, the OLED devices attract attention as a next-generation display device because of high-grade characteristics of low power consumption, high brightness, and high response speed.

Recently, such display devices have been developed to have a flexible, foldable or extendable structure.

SUMMARY

Various embodiments of the present disclosure are directed to a display device capable of displaying an image with uniform brightness even when it is elongated.

An embodiment of the present disclosure may provide a display device including: a substrate including a pixel area, and a peripheral area surrounding the pixel area, the pixel area including a first area and a second area surrounding the first area; a base layer disposed on the pixel area, and comprising a plurality of island patterns on which respective pixels are provided and a plurality of bridge patterns coupling the adjacent island patterns to each other, the plurality of island patterns and the plurality of bridge patterns disposed on the first area; and a plurality of first protrusions and a plurality of second protrusions disposed on the base layer, and protruding into the second area.

In an embodiment, signal lines coupled to the pixels may be provided on the plurality of bridge patterns.

In an embodiment, each of the plurality of island patterns may have a rectangular shape, and respective sides of the plurality of island patterns may be coupled with a plurality of corresponding bridge patterns.

In an embodiment, the display device may further include sensing lines provided on the haw layer and configured to measuring a degree of elongation of the substrate.

In an embodiment, the plurality of first protrusions and the plurality of second protrusions may be included in the sensing lines.

In an embodiment, when the substrate is not elongated, the plurality of first protrusions and the plurality of second protrusions may come into contact with each other. When the substrate is elongated, the plurality of first protrusions and the plurality of second protrusions may be spaced apart from each other.

In an embodiment, the plurality of first protrusions may protrude from one side of each of the plurality of island patterns, and the plurality of second protrusions may protrude from one side of the plurality of corresponding bridge patterns so that the plurality of second protrusions are connected with the plurality of first protrusions in the second area.

In an embodiment, the display device may include: a scan driver configured to supply a scan signal to the pixels through scan lines; a data driver configured to supply a data signal to the pixels through data lines, a sensing unit configured to measuring the degree of elongation of the substrate with reference to variation in resistance of the sensing lines; and a data compensation unit configured to compensate for the data signal with reference to the degree of elongation of the substrate.

In an embodiment, the sensing lines may come into contact with the data lines.

In an embodiment, the data driver may supply the data signal for displaying an image to the data lines during a first period. The data driver may supply a reference data signal to the data lines during a second period, the reference data signal being provided for measuring the degree of elongation of the substrate.

In an embodiment, the sensing unit may sense current flowing through the data lines during the second period.

In an embodiment, each of the plurality of first protrusions and the plurality of second protrusions may comprise a plurality of first sub-protrusions and a plurality of second sub-protrusions provided between each of the plurality of island pattern and the plurality of corresponding bridge pattern coupled with the plurality of island patterns. As the degree of elongation of the substrate is increased, the numbers of the plurality of first sub-protrusions and the plurality of second sub-protrusions in contact with each other may be reduced.

In an embodiment, the display device may further include a drive voltage line and a sub-drive voltage lure configured to supply a first power supply to the pixels.

In an embodiment, the plurality of first protrusions and the plurality of second protrusions may be included in the sub-drive voltage line.

In an embodiment, when the substrate is not elongated, the plurality of first protrusions and the plurality of second protrusions may be spaced apart from each other. When the substrate is elongated, the plurality of first protrusions and the plurality of second protrusions n may come into contact with each other.

In an embodiment, when the substrate is elongated, the first power supply may be supplied to the pixels through the drive voltage line and the sub-drive voltage line.

In an embodiment, each of the plurality of first protrusions may protrude from one side of each of the plurality of island patterns, and each of the plurality of second protrusions may protrude from one side of another island pattern adjacent to the island pattern from which the each of the plurality of first protrusion protrudes.

In an embodiment, the first protrusion may protrude from one side of each of the island patterns, and the second protrusion may protrude from one side of another island pattern adjacent to the island pattern from which the first protrusion protrudes.

In an embodiment, the display device may further include: a first insulating layer provided on the base layer; and a second insulating layer provided on the first insulating layer.

In an embodiment, the drive voltage line may be provided on the second insulating layer.

In at embodiment, each of the pixels may include a transistor, and the transistor may include: a gate electrode provided on the first insulating layer; and a source electrode and a drain electrode provided on the second insulating layer.

In an embodiment, the plurality of first protrusions and the plurality of second protrusions may be provided on the second insulating layer.

In an embodiment, the drive voltage line and the sub-drive voltage line may be provided on an identical layer.

An embodiment of the present disclosure may provide a method of driving a display device, including a substrate and pixels disposed on the substrate, the method including: supplying a reference data signal to data lines; calculating a degree of elongation of the substrate with reference to current flowing through the data lines; compensating for a data signal for displaying an image with reference to the degree of elongation of the substrate; and supplying the compensated data signal to the pixels through the data lines.

In an embodiment, sensing lines including a first protrusion and a second protrusion may be coupled to the data lines. When the substrate is not elongated, the first protrusion and the second protrusion may come into contact with each other. When the substrate is elongated, the first protrusion and the second protrusion may be spaced apart from each other.

In an embodiment, as the degree of elongation of the substrate may be increased, resistance of the sensing lines is increased.

In an embodiment, the data signal may be compensated so that brightness when the substrate is elongated may be higher than that when the substrate is not elongated.

BRIEF DESCRIPTION OF THE DRAWINGS

Example embodiments will now be described more fully hereinafter with reference to the accompanying drawings: however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Figure 1:
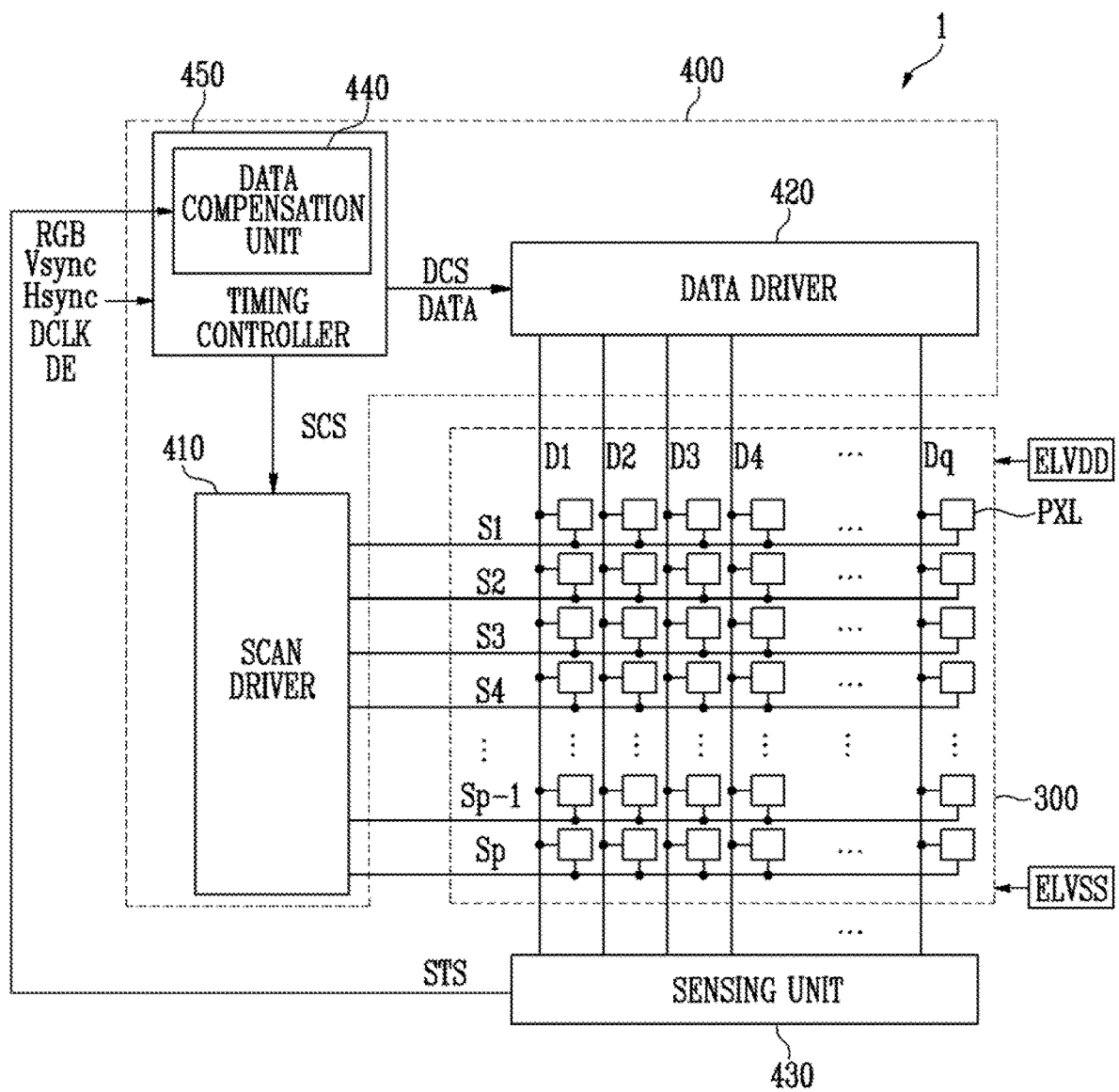
FIG. 1 is a block diagram schematically illustrating configuration of an organic light emitting diode (OLED) device in accordance with an embodiment of the present disclosure.

Details of various embodiments are included in the detailed descriptions and figures.

Advantages and features of the present disclosure, and methods for achieving the same will be cleared with reference to embodiments described later in detail together with the accompanying drawings. The present disclosure is not limited to the following embodiments, and various modifications are possible. It will be understood that when an element is referred to as being "coupled" to another element, it may be directly coupled to the element or electrically coupled thereto with other elements interposed therebetween. Furthermore, in drawings, portions unrelated to the present disclosure have been omitted to clarify the description of the present inventive concept, and the same reference numerals are used throughout the different drawings to designate the same or similar components.

Hereinafter, an organic light emitting diode (OLED) device in accordance with an embodiment of the present disclosure will be described with reference to the attached drawings pertaining to embodiments of the present disclosure.

Figure 2:
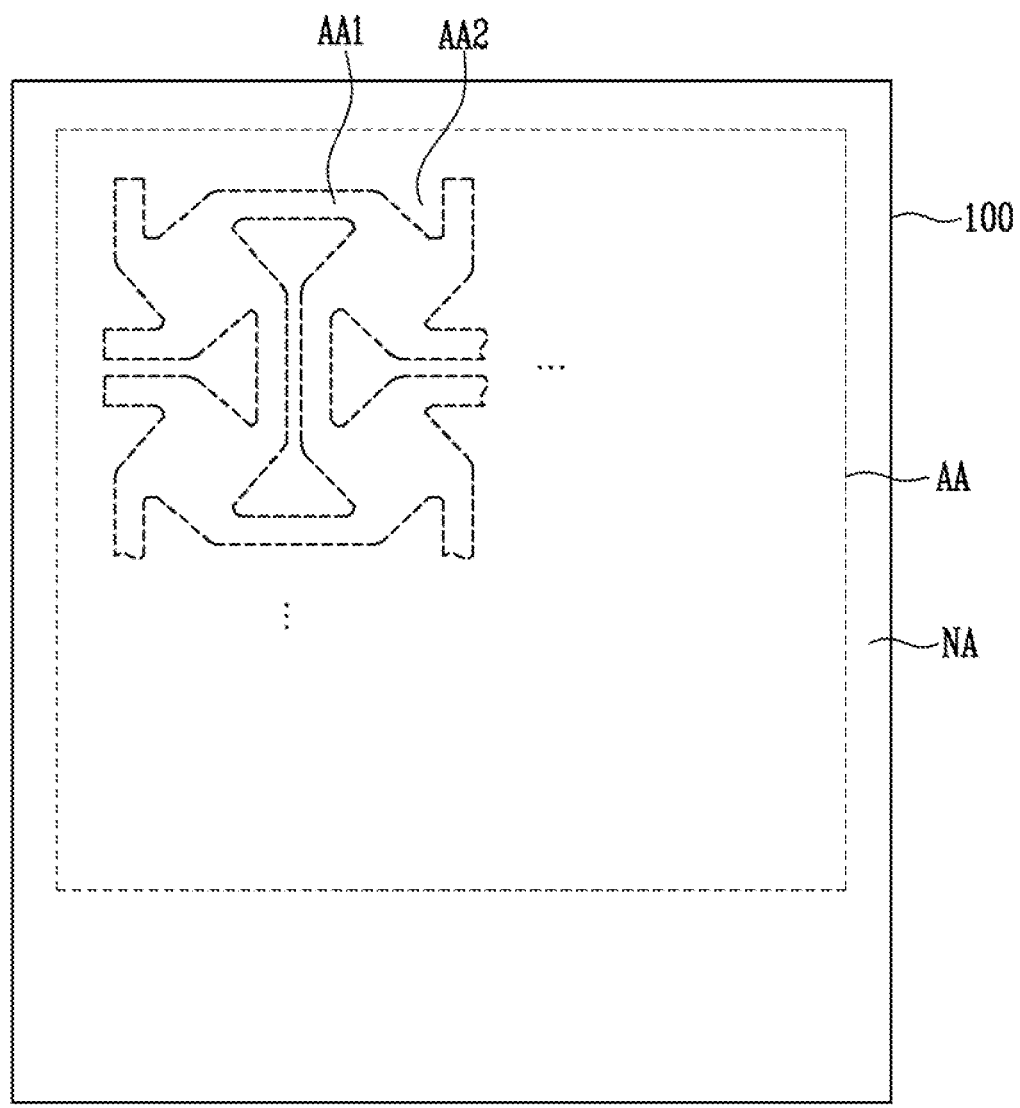
FIG. 2 is a diagram illustrating a substrate included in the OLED device in accordance with an embodiment of the present disclosure.

FIG. 1 is a block diagram schematically illustrating configuration of an OLED device 1 in accordance with an embodiment of the present disclosure. FIG. 2 is a diagram illustrating a substrate 100 included in the OLED device 1 in accordance with an embodiment of the present disclosure.

Referring to FIG. 1, the OLED device 1 in accordance with an embodiment of the present disclosure may include a display panel 300 and a display drive unit 400.

The display panel 300 may include pixels PXL, and data lines D1 to Dq and scan lines S1 to Sp which are coupled to the pixels PXL.

The respective pixels PXL may receive data signals and scan signals through the corresponding data lines D1 to Dq and the corresponding scan lines S1 to Sp.

The pixels PXL may be coupled with a first power supply ELVDD and a second power supply ELVSS.

Each pixel PXL may include a light-emitting element (e.g., OLED). The pixel PXL may generate light corresponding to a data signal by current flowing from the first power supply ELVDD to the second power supply ELVSS via the light-emitting element.

The display drive unit 400 may include a scan driver 410, a data driver 420, a sensing unit 430, a data compensation unit 440, and a timing controller 450.

The scan driver 410 may supply scan signals to the scan lines S1 to Sp in response to a scan driver control signal SCS. For example, the scan drier 410 may sequentially supply scan signals to the scan lines S1 to Sp.

For connection with the scan lines S1 to Sp, the scan driver 410 may be directly mounted on the substrate 100 provided with the pixels PXL, or be coupled with the substrate 100 by a separate component such as a flexible circuit board.

The data driver 420 may receive a data driver control signal DCS and image data DATA from the timing controller 450 and generate a data signal.

In an embodiment, each frame may include a first period and a second period. The first period may be a period for which data signals for displaying an image are supplied to the pixels PXL and the image corresponding to the data signals is displayed. The second period my be a period other than the first period in each frame period, in other words, be a non-display period for which an image is not displayed.

The data driver 420 may supply generated data signals to the data lines D1 to Dq during the first period.

The data driver 420 may supply a reference data signal for sensing resistances of the data lines D1 to Dq during, the second period.

For connection with the data lines D1 to Dq, the data driver 420 may be directly mounted on the substrate 100 provided with the pixels PXL, or be coupled with the substrate 100 by a separate component such as a flexible circuit board.

If a scan signal is supplied to a certain scan line, some pixels PXL coupled with the certain scan line may receive data signals transmitted from the corresponding data lines D1 to Dq. Thus, the some pixels PXL may rant light at brightness corresponding to the received data signals.

The sensing unit 430 may sense a degree of elongation of the OLED device by sensing currents flowing through the respective data lines D1 to Dq during the second period, and calculate variation in resistance in sensing lines disposed in the OLED device 1 from the currents.

The sensing unit 430 may sense the degree of elongation of the OLED device with reference to variation in resistance of the sensing lines.

The sensing unit 430 may transmit, to a data compensation unit 440, a signal STS indicating the degree of elongation of the OLED device.

The data compensation unit 440 may compensate for a data signal to be provided to the display panel 300, with reference to the signal STS obtained from the sensing unit 430.

A method of compensating for the brightness of an image to be displayed on the display panel 300 using the sensing unit 430 and the data compensation unit 440 will be described hereinafter.

The timing controller 450 may generate control signals for controlling the scan driver 410 and the data driver 420.

For example, the control signals array include a scan driver control signal SCS for controlling the scan driver 410, and a data driver control signal DCS for controlling the data driver 420.

The timing controller 450 may generate the scan driver control signal SCS and the data driver control signal DCS using an external input signal from a graphic controller (not shown).

For example, the external input signal may include a dot clock DCLK, a data enable signal DE, a vertical synchronization signal Vsync, and a horizontal synchronization signal Hsync.

The tuning controller may supply the scan driver control signal SCS to the scan driver 410, and supply the data driver control signal DCS to the data driver 420.

The timing controller 450 may convert image data RGB inputted from an external device into image data DATA compatible to the specifications of the data driver 420, and then supply the image data DATA to the data driver 420.

The data enable signal DE may be a signal defining a period for which valid data is inputted. One cycle may be set as one horizontal period equal to that of the horizontal synchronization signal Hsync.

Referring to FIG. 1, there is illustrated an example in which the scan driver 410, the data driver 420, and the timing controller 450 are separately provided, but at least some of the foregoing components may be integrated with each other, as needed.

Furthermore, in FIG. 1, the data compensation unit 440 is illustrated as being integrated with the timing controller 450, but the data compensation unit 440 may be integrated with the sensing unit 430 or be separately provided from the sensing unit 430 and the timing controller 450.

The scan driver 410, the data driver 420, and the timing controller 450 may be installed in various forms, e.g., a chip-on-glass form, a chip-on-plastic form, a tape carrier package form, and a chip-on-film form.

Referring to FIG. 2, the substrate 100 of the display panel 300 may be a structure for supporting the pixels PXL formed on an upper surface thereof and be elongatable so that it may stretch or shrink in at least one direction.

The substrate 100 may include a pixel area AA and a peripheral area NA.

The plurality of pixels PXL are disposed in the pixel area AA so that an image may be displayed on the pixel area AA. Thus, the pixel area AA may refer to a display area.

Components (e.g., the display drive unit 400 and signal lines) for driving the pixels PXL may be disposed in the peripheral area NA. The peripheral area NA may refer to a non-display area because the pixels PXL are not present therein.

For example, the peripheral area NA may be formed outside the pixel area AA and have a shape in which it encloses at least some of the pixel area AA.

The substrate 100 may be made of insulating material such as resin. Furthermore, the substrate 100 may be made of material having flexibility so as to be bendable or foldable, and have a single layer or multilayer structure.

For example, the substrate 100 may include at least one of the following: polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate, and polyurethane.

Referring to FIG. 2, the pixel area AA may include a first area AA1 and a second area AA2.

An island pattern and a bridge pattern of a base layer, which will be described hereinafter, may be provided in the first area AA1. Therefore, the shape of the first area AA1 may correspond to that of the island pattern and bridge pattern.

The second area AA2 may be a peripheral area of the first area AA1, be formed outside the first area AA1, and have a shape in which it enclose the perimeter of the first area AA1.

A base layer may not be provided on the second area AA2 other than an area overlapping sensing lines and a sub-drive voltage line, which will be described later herein.

Figure 3:
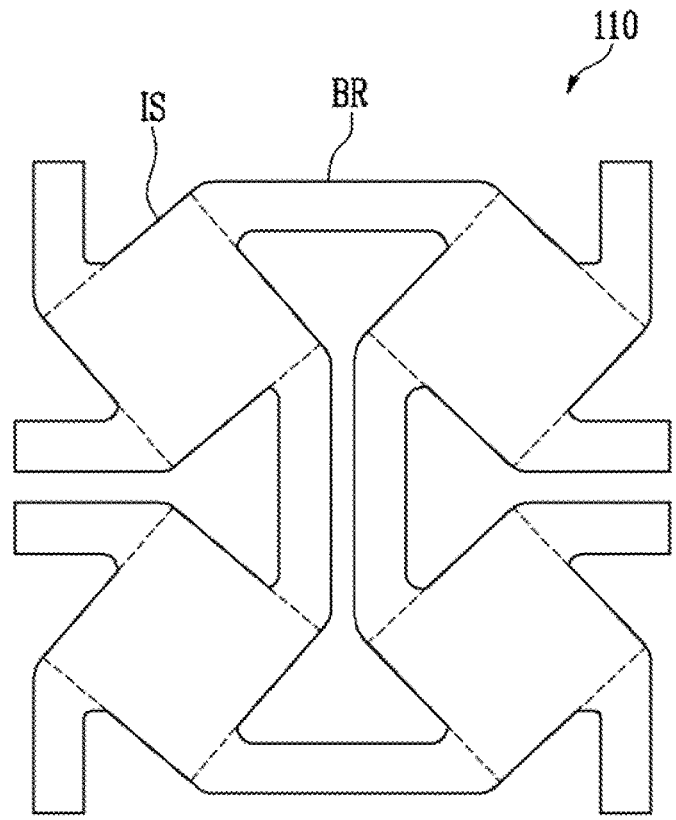
FIG. 3 is a diagram illustrating island patterns and bridge patterns of a base layer in accordance with an embodiment of the present disclosure.

FIG. 3 is a diagram illustrating island patterns and bridge patterns of a base layer in accordance with an embodiment of the present disclosure.

Referring to FIG. 3, the base layer 110 may have an island shape and include a plurality of island patterns IS and a plurality of bridge patterns BR.

In detail, the plurality of island patterns IS may be regularly arranged in first axis (X-axis) and second axis (X-axis) directions. Adjacent island patterns IS may be coupled with each other by at least one bridge pattern BR.

A pixel structure (e.g., a thin film transistor, a capacitor, and an OLED) may be formed on each island pattern IS. A single pixel PXL may be formed on each island pattern IS, or a plurality of pixels PXL may be formed thereon.

Each bridge pattern BR may be provided with lines for supplying a supply voltage, a data signal, a scan signal, and so forth to the corresponding pixel structure.

When the OLED device 1 is elongated or contracted, the distance between the island patterns IS may be increased or decreased. In this case, the shapes of the respective island patterns may not be deformed. That is, each island pattern IS may not be increased or reduced in width and height. Hence, the structure of the pixel PXL formed on the island pattern IS may also not be deformed.

However, when the substrate 100 is elongated, the bridge patterns BR coupling the island patterns IS with each other may be deformed.

Referring to FIG. 3, there is illustrated an example in which each island pattern IS has a rectangular shape, but the present disclosure is not limited to this. For instance, the shape of the island pattern IS may be altered in various ways. The shape of each of the bridge pattern BR coupling the island patterns IS with each other may also altered into various ways without restriction.

Figure 4:
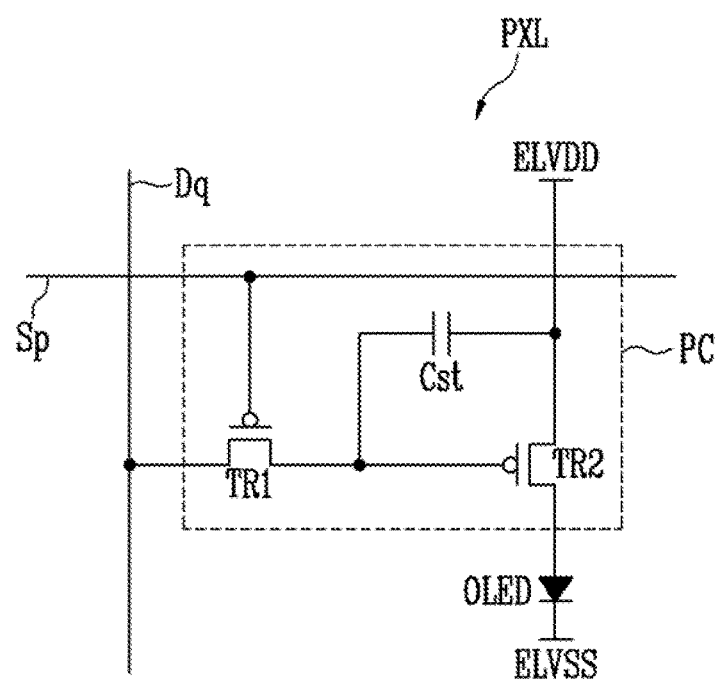
FIGS. 4 and 5 are diagrams illustrating embodiments of a pixel shown in FIG. 1.
Figure 5:
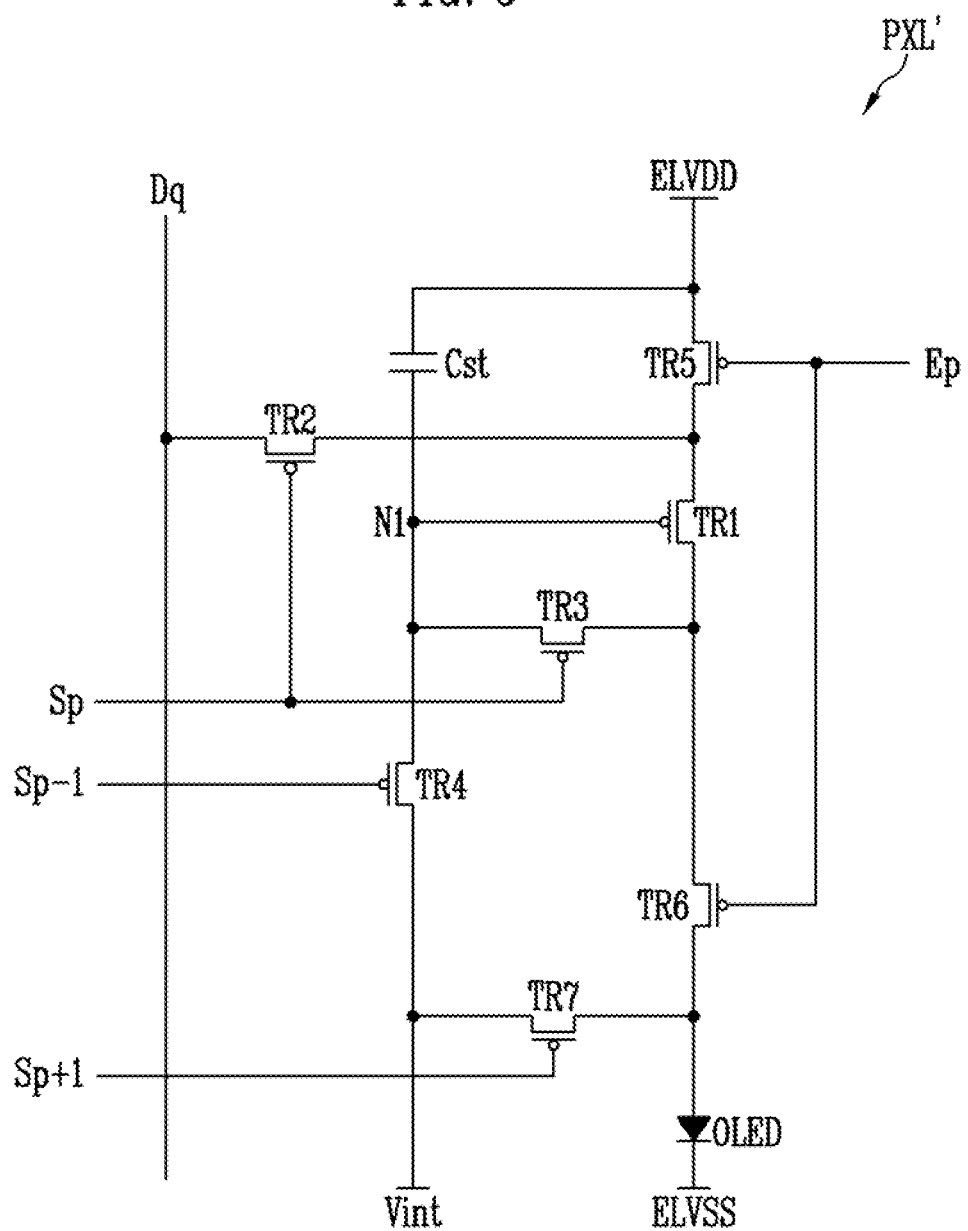

FIGS. 4 and 5 are diagrams illustrating embodiments of a pixel shown in FIG. 1. For the sake of explanation, FIGS. 4 and 5 respectively illustrate only pixels PXL and PXL' which are coupled with a p-th scan line Sp and a g-th data line Dq.

Referring to FIG. 4, the pixel PXL may include an OLED, and a pixel circuit PC which is coupled to the q-th data line Dq and the p-th scan line Sp to control the OLED.

An anode electrode of the OLED May be coupled to the pixel circuit PC, and a cathode electrode thereof may be coupled to the second power supply ELVSS.

The OLED may emit light having a predetermined brightness corresponding to current supplied from the pixel circuit PC.

The pixel circuit PC may store a data signal supplied from the q-th data line Dq when a scan signal is supplied from the p-th scan line Sp. The pixel circuit PC may control current to be supplied to the OLED, in response to the store data signal.

In an embodiment, the pixel circuit PC may include a first transistor TR1, a second transistor TR2, and a storage capacitor Cst.

The first transistor TR1 May be coupled between the q-th data line Dq and the second transistor TR2.

For example, a gate electrode of the first transistor TR1 may be coupled to the p-th scan line Sp, a first electrode thereof may be coupled to the g-th data line Dq, and a second electrode thereof may be coupled to a gate electrode of the second transistor TR2.

When a scan signal is supplied from the p-th scan line Sp, the first transistor TR1 is turned on so that a data signal is supplied from the q-th data line Dq to the storage capacitor Cst.

Here, the storage capacitor Cst may be charged to voltage corresponding to the data signal.

The second transistor TR2 may be coupled between the first power supply ELVDD and the OLED.

In an embodiment, the gate electrode of the second transistor TR2 may be coupled to a lint electrode of the storage capacitor Cst and to the second electrode of the first transistor TR1. A first electrode of the second transistor TR2 may be coupled to a second electrode of the storage capacitor Cst and to the first power supply ELVDD. A second electrode of the second transistor TR2 may be coupled to the anode electrode of the OLED.

The second transistor TR2 may function as a drive transistor and control, in correspondence with a voltage stored in the storage capacitor Cst, current flowing from the first power supply ELVDD to the second power supply ELVSS via the OLED.

The OLED may generate light corresponding to current supplied from the second transistor TR2.

Here, the first electrode of each transistor TR1, TR2 may be either a source electrode or a drain electrode. The second electrode of each transistor TR1, TR2 may be an electrode different from the first electrode. For example, if the first electrode is the source electrode, the second electrode may be the drain electrode.

In FIG. 4, there is illustrated an example in which the transistors TR1 and TR2 are PMOS transistors, but in various embodiments, the transistors TR1 and TR2 may be embodied by NMOS transistors.

The first power supply ELVDD may be a high-potential voltage, and the second power supply ELVSS may be a low-potential voltage.

For example, the first power supply ELVDD may be set as a positive voltage, and the second power supply ELVSS may be set as a negative voltage or ground voltage.

Referring to FIG. 5, the pixel PXL' in accordance with an embodiment of the present disclosure may include an OLED, first to seventh transistors TR1 to TR7, and a storage capacitor Cst.

An anode electrode of the OLED may be coupled to the first transistor TR1 via the sixth transistor TR6, and a cathode electrode thereof may be coupled to the second power supply ELVSS. The OLED may emit light having a predetermined brightness corresponding to current supplied from the first transistor TR1.

The first power supply ELVDD may be set as a voltage higher than that of the second power supply ELVSS so that current can flow to the OLED.

The seventh transistor TR7 may be coupled between an initialization power supply Vint and an anode electrode of the OLED. A gate electrode of the seventh transistor TR7 may be coupled to a p+1-th scan line Sp+1. When a scan signal is supplied from the p+1-th scan line Sp+1, the seventh transistor TR7 is turned on so that a voltage of the initialization power supply Vint may be supplied to the anode electrode of the OLED. The initialization power supply Vint may be set as a voltage lower than that of a data signal.

In FIG. 5, there is illustrated an example in which the seventh transistor TR7 is initialized m response to a scan signal supplied to the p+1-th scan line Sp+1. However, the present disclosure is not limited to this. For example, the seven transistor TR7 may be initialized in response to a scan signal supplied to a p-1-th scan line Sp-1.

The sixth transistor TR6 may be coupled between the first transistor TR1 and the OLED. A gate electrode of the sixth transistor TR6 may be coupled to a p-th emitting control line Ep. The sixth transistor TR6 may be turned off when a light-emitting control signal is supplied to the p-th Light-emitting Ep, and be turned on in other cases.

The fifth transistor TR5 may be coupled between the first power supply ELVDD and the first transistors TR1. A gate electrode of the fifth transistor TR5 may be coupled to the p-th light-emitting control line Ep. The fifth transistor TR5 may be turned off when a light-emitting control signal is supplied to the p-th light-emitting Ep, and be turned on in other cases.

A first electrode of the first transistor (TR1, drive transistor) may be coupled to the first power supply ELVDD via the fifth transistor TR5, and a second electrode thereof may be coupled to the anode electrode of the OLED via the sixth transistor TR6. A gate electrode of the first transistor TR1 may be coupled to a first node N1. The first transistor TR1 may control, in correspondence with a voltage of the first node N1, current flowing from the first power supply ELVDD to the second power supply ELVSS via the OLED.

The third transistor TR3 may be coupled between a second electrode of the first transistor TR1 and the first node N1. A gate electrode of the third transistor TR3 may be coupled to a p-th scan line Sp. When a scan signal is supplied to the p-th scan line Sp, the third transistor TR3 may be turned on so that the second electrode of the first transistor TR1 can be electrically coupled with the first node N1. Therefore, when the third transistor TR3 is turned on, the first transistor TR1 may be connected in the form of a diode.

The fourth transistor TR4 may be coupled between the first node N1 and the initialization power supply Vint. A gate electrode of the fourth transistor TR4 may be coupled to a p-1-th scan line Sp-1. When a scan signal is supplied to the p-1-th scan line Sp-1, the fourth transistor TR4 is turned on so that the voltage of the initialization power supply Vint can be supplied to the first node N1.

The second transistor TR2 may be coupled between the q-th data line Dq and the first electrode of the first transistor TR1. A gate electrode of the second transistor TR2 may be coupled to the p-th scan line Sp. When a scan signal is supplied to the p-th scan line Sp, the second transistor TR2 may be turned on so that the first electrode of the first transistor TR1 can be electrically coupled with the q-th data line Dq.

The storage capacitor Cst may be coupled between the first power supply ELVDD and the first node N1. The storage capacitor Cst may store a data signal and a voltage corresponding to a threshold voltage of the first transistor TR1.

Here, the first electrode of each transistor TR1, TR2, TR4, TR5, TR6, TR7 may be either a source electrode or a drain electrode. The second electrode of each transistor TR1, TR2, TR3, TR4, TR5, TR6, TR7 may be an electrode different from the first electrode. For example, if the first electrode may be the source electrode, the second electrode may be the drain electrode.

In FIG. 5, there is illustrated an example in which the transistors TR1, TR2, TR3, TR4, TR5, TR6, and TR7 are PMOS transistors, but in various embodiments, the transistors TR1, TR2, TR3, TR4, TR5, TR6, and TR7 may be embodied by NMOS transistors.

The first power supply ELVDD may be a high-potential power supply, and the second power supply ELVSS may be a low-potential power supply.

For example, the first power supply ELVDD may be set as a positive voltage, and the second power supply ELVSS may be set as a negative voltage or ground voltage.

Hereinbelow, the configuration of the pixel PXL formed on the island pattern IS will be described with reference to FIGS. 6 and 7.

Figure 6:
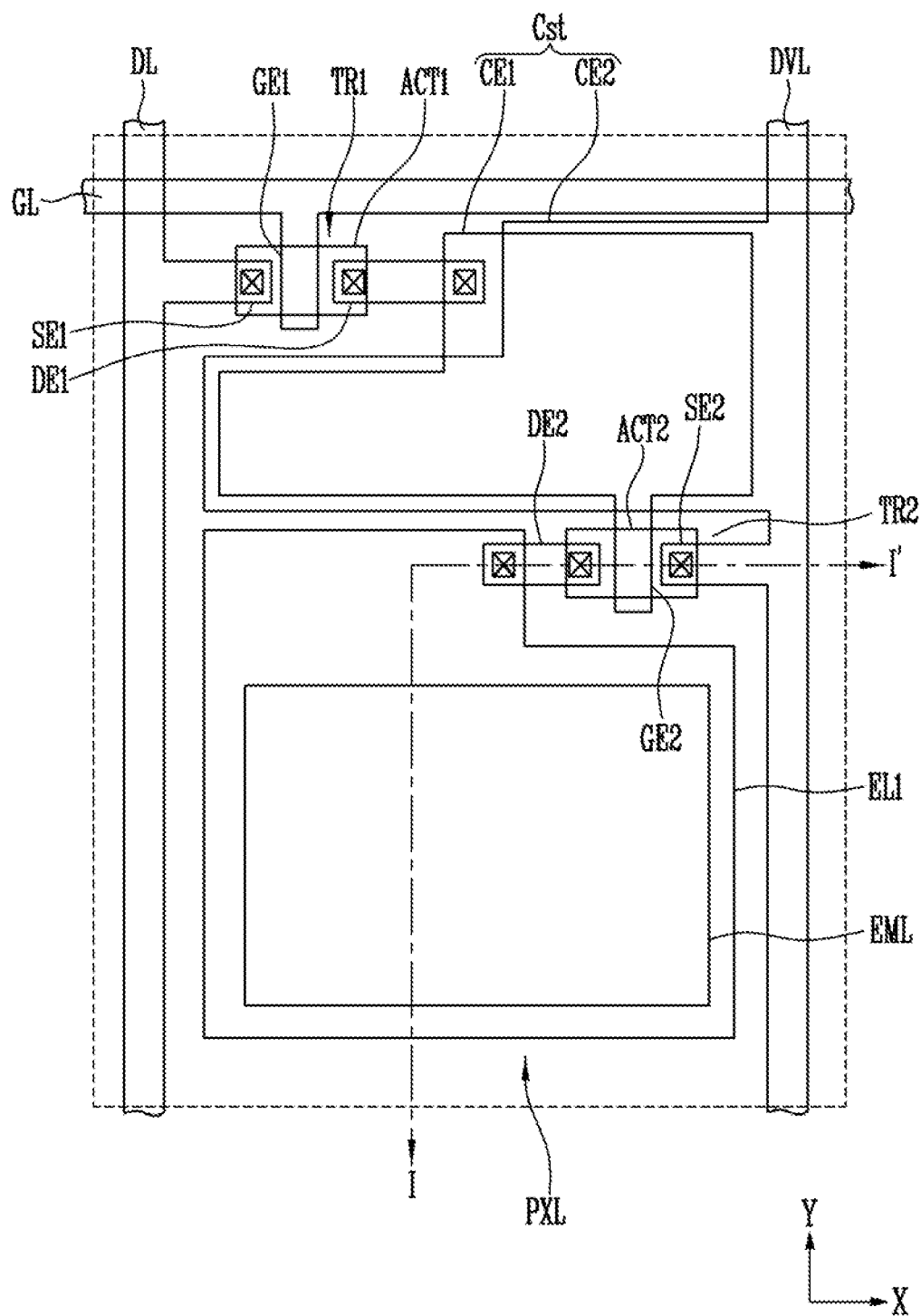
FIG. 6 is a plan view illustrating an example of configuration of the pixel shown in FIG. 4.

FIG. 6 is a plan view illustrating an example of the configuration of the pixel shown in FIG. 4. FIG. 7 is a sectional view taken along line I-I' of FIG. 6.

Figure 7:
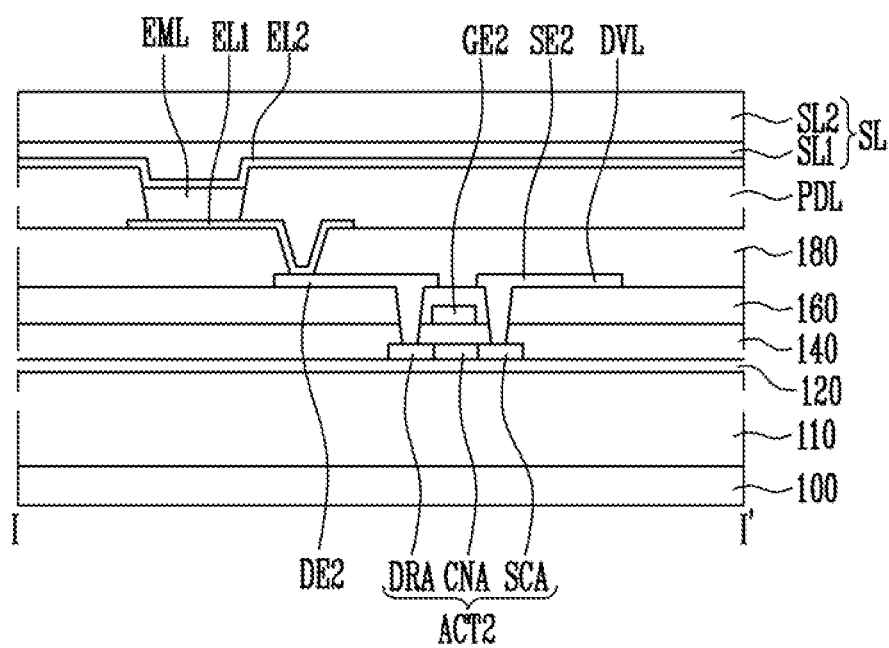
FIG. 7 is a sectional view taken along line I-I' of FIG. 6.

Referring to FIGS. 6 and 7, a gate line GL may extend in either a first direction (X-axis direction) or a second direction Y-axis direction)

A data line DL may extend in a direction intersecting the gate line GL.

A drive voltage line DVL may extend in substantially the same direction as that of the data line DL.

The gate line GL may transmit a scan signal to the first transistor TR1. The data line DL may transmit a data signal to the first transistor TR1. The drive voltage line DVL may provide the first power supply ELVDD to the second transistor TR2.

That is, the Rate line GL may correspond to the scan lines S1 to Sp illustrated in FIG. 1. The data fine DL may correspond to the data lines D1 to Dq illustrated in FIG. 1.

The first transistor TR1 may include a first gate electrode GE1, a first source electrode SE1, and a first drain electrode DE1. The first gate electrode GE1 may be coupled to the gate line GL. The first source electrode SE1 may be coupled to the data line DL. The first drain electrode DE1 may be coupled to a gate electrode (i.e., second gate electrode GE2) of the second transistor TR2.

The first transistor TR1 may transmit a data signal applied to the data line DL to the second transistor TR2 in response to a scan signal applied to the gate line GL.

The second transistor TR2 may include a second gate electrode GE2, a second source electrode SE2, and a second drain electrode DE2. The second gate electrode GE2 may be coupled to the first transistor TR1. The second source electrode SE2 may be coupled to the drive voltage line DVL, and the second drain electrode DE2 may be coupled to the light-emitting element.

The light-emitting element may include a light-emitting layer EML and a first electrode EL1 and a second electrode EL2 which face each other with the light-emitting layer EML interposed therebetween.

The first electrode EL1 may be coupled with the second drain electrode DE2 of the second transistor TR2. A common voltage may be applied to the second electrode EL2. The light-emitting layer EML may emit light in response to an output signal of the second transistor TR2. Here, light emitted from the light-emitting layer EML may be changed depending, on the material of the light-emitting layer, and may be color light or white light.

The capacitor Cst may be coupled between the second gate electrode GE2 and the second source electrode SE2 of the second transistor TR2 and function to charge and retain a data signal, inputted to the second gate electrode GE2 of the second transistor TR2.

Hereinafter, the above-mentioned elements of the pixel PXL will be described in a sequence in which they are stacked.

Each pixel PXL in accordance with an embodiment may be provided on a corresponding island pattern IS of the base layer 110.

The base layer 110 may be disposed on the substrate 100 and be made of polyimide, polyamide, or polyacrylates.

A buffer layer 120 including inorganic material such as a silicon oxide, a silicon nitride, and/or a silicon oxynitride may be provided on the base layer 110.

The buffer layer 120 may function to enhance the smoothness of the upper surface of the base layer 110 or prevent or minimize impurities from entering the transistor TR1 or TR2 from the base layer 110 or the like.

The buffer layer 120 may be formed of a silicon oxide, a silicon nitride and/or a silicon oxynitride, and omitted depending on the material of the base layer 110 or process conditions.

The buffer layer 120 may have a single layer structure or a multilayer structure.

A first active pattern ACT1 and a second active pattern ACT2 may be provided on the buffer layer 120. Each of the first and second active patterns ACT1 and ACT2 may be formed of semiconductor material. Each of the first and second active patterns ACT1 and ACT2 may include a source area SCA, a drain area DRA, and a channel area CNA provided between the source area SCA and the drain area DRA. Each of the first and second active patterns ACT1 and ACT2 may be a semiconductor pattern made of poly silicon, amorphous silicon, an oxide semiconductor or the like. Particularly, the channel area CNA may be a semiconductor pattern undoped with impurities and thus be an intrinsic semiconductor. Each of the source area. SCA and the drain area DRA may be a semiconductor pattern doped with an impurity. The impurity may be an impurity such as an n-type impurity, a p-type impurity or other metals.

The oxide semiconductor may include any one of oxides a titanium (Ti), hafnium (Hf), zirconium (Zr), aluminum (Al), tantalum (Ta), germanium (Ge), zinc (Zn), (Ga), tin (Sn), or indium (In), and complex oxides thereof including a zinc oxide (ZnO), an indium-gallium-zinc oxide (In-GaZnO$_4$), an indium-zinc oxide (Zn—In—O), a zinc-tin oxide (Zn—Sn—O), an indium-gallium oxide (In—Ga—O), an indium-tin oxide (In—Sn—O), an indium-ziroconium oxide (In—Zr—O), an indium-ziroconium-zinc oxide (In—Zr—Zn—O), an indium-ziroconium-tin oxide (In—Zr—Sn—O), an indium-ziroconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium oxide (In—Ge—Ga—O), a titanum-indium-zinc oxide (Ti—In—Zn—O), and a halnium-indium-zinc oxide (Hf—In—Zn—O).

A first insulating layer 140 may be provided on the first and second active pattern ACT1 and ACT2. The first insulating layer 140 may be formed of a single layer or multilayer structure including a silicon oxide, a silicon nitride and/or silicon oxynitridie.

The first gate electrode GE1 coupled with the gate line GL, and the second gate electrode GE2 may be provided on the first insulating layer 140. The gate line GL, the first gate electrode GE1, and the second gate electrode GE2 may be made of metal.

The metal may include molybdenum (Mo), or include at least, one of metals such as gold (Au), silver (Ag), aluminum (Al), chrome (Cr), titanium (Ti), nickel (Ni), neodymium (Nd), and copper (Cu), or an alloy of the metals.

Each of the gate line GL, the first gate electrode GE1 and the second gate electrode GE2 may have a single layer structure, but the present disclosure is not limited to this, for example, it may have a multilayer structure formed by stacking two or more materials of metals and alloys.

The first gate electrode GE1 and the second gate electrode GE2 may respectively cover areas corresponding to the channel areas CNA of the first and second active patterns ACT1 and ACT2.

A second insulating layer 160 may be provided on the first and second gate electrodes GE1 and GE2 and formed to cover the first and second gate electrodes GE1 and GE2. The second insulating layer 160 may include inorganic material such as a silicon oxide, a silicon nitride, and/or a silicon oxynitride.

The first source electrode SE1, the first drain electrode DE1, the second source electrode SE2, and the second drain electrode DE2 may be provided on the second insulating layer 160.

The first source electrode SE1 and the first drain electrode DE1 may respectively come into contact with the source area and the drain area of the first active pattern ACT1 through contact holes formed in the first and second insulating layers 140 and 160.

The second source electrode SE2 and the second, drain electrode DE2 may respectively come into contact with the source area SCA and the drain area DRA of the second active pattern ACT2 through contact holes formed in the first and second insulating layers 140 and 160.

The source electrodes SE1 and SE2, the drain electrodes DE1 and DE2, and the drive voltage line DVL that are provided on the second insulating layer 160 may be made of metal. For example, each of the source electrodes SE1 and SE2, the drain electrodes DE1 and DE2, and the drive voltage line DVL may be made of at least one of metals such as gold (Au), silver (Ag), aluminum (Al), molybdenum (Mo), chrome (Cr), titanium (Ti), nickel (Ni), neodymium (Nd), copper (Cu), or an alloy of the metals.

A portion of the second gate electrode GE2 and a portion of the drive voltage line DVL may be respectively a first capacitor electrode CE1 and a second capacitor electrode CE2, and form the capacitor Cst with the second in her 160 interposed therebetween.

A third insulating layer 180 may be provided on the first source electrode SE1, the first drain electrode DE1, the second source electrode SE2, and the second drain electrode DE2. The third insulating layer 180 may function as a protective layer for protecting the transistors TR1 and TR2, or as a planarization layer for planarizing an upper surface thereof.

The first electrode EL1 may be provided on the third insulating layer 180 as an anode of the light-emitting element. The first electrode EL1 may be coupled to the second drain electrode DE2 of the second transistor TR2, through a contact hole formed in the third insulating layer 180. The first electrode EL1 may be used as a cathode, but in the following embodiment, there will be described an example in which it is used as an anode.

The first electrode EL1 may include transparent conductive material such as an indium tin oxide (ITO), an indium zinc oxide (IZO), a zinc oxide (ZnO) or an indium oxide (In$_2$O$_3$), or reflective metal such as lithium (Li), calcium (Ca), lithium fluoride/calcium (LiF/Ca), lithium fluoride/aluminum (LiF/Al), aluminum (Al), silver (Ag), magnesium (Mg), or gold (Au).

A pixel defining layer PDL for defining a pixel area corresponding to each pixel PXL is provided on the first electrode EL1. The pixel defining layer PDL may include an opening through which the upper surface of the first electrode EL1 is exposed. That is, the pixel defining layer PDL may define the pixel area corresponding to each pixel. However, according to another embodiment, the first electro EL1 may be provided on the pixel defining layer PDL.

The light-emitting layer EML may be provided in the opening of the pixel defining layer PDL.

The second electrode EL2 may be provided on the pixel defining layer PDL and the light-emitting layer EML. The second electrode EL2 may be harmed of a metal layer made of Ag, Mg, Al, Pt, Pd, Au, Ni, Nd, Ir, Cr, or the like, and/or a transparent conductive layer made of an indium tin oxide (ITO), an indium zinc oxide (IZO), a zinc oxide (ZnO), an indium tin zinc oxide (ITZO), or the like. In an embodiment of the present disclosure, the second electrode EL2 may be formed of a multilayer structure having two or more layers including a thin metal layer. For example, the second electrode EL2 may be formed of a triple-layer Structure of ITO/Ag/ITO.

An encapsulation layer SL may be provided on the second electrode EL2 to cover the second electrode EL2. The encapsulation layer SL may be formed of a single layer, or multi-layers.

In an embodiment, the encapsulation layer SL may include a first encapsulation layer SL1 and a second encapsulation layer SL2. The first encapsulation layer SL1 and the second encapsulation layer SL2 may include different materials. For example, the first encapsulation layer SL1 may be made of organic material, and the second encapsulation layer SL2 may be made of inorganic material.

The layer structure or material of the encapsulation layer SL is not limited to this embodiment, and may be changed in various manners. For example, the encapsulation layer SL may include a plurality of organic material layers and a plurality of inorganic material layers that are alternately stacked.

The structure of the pixel PXL or PXL' illustrated in FIGS. 4 to 7 is provided only for illustrative purpose, and the structure of the pixel PXL or PXL' of the present disclosure is not limited to the foregoing examples. For example, the number of transistors and capacitors included in the pixel PXL or PXL' may be changed in various manners. The structures of transistors and capacitors included in the pixel PXL or PXL' may also be changed in various manners.

Figure 8:
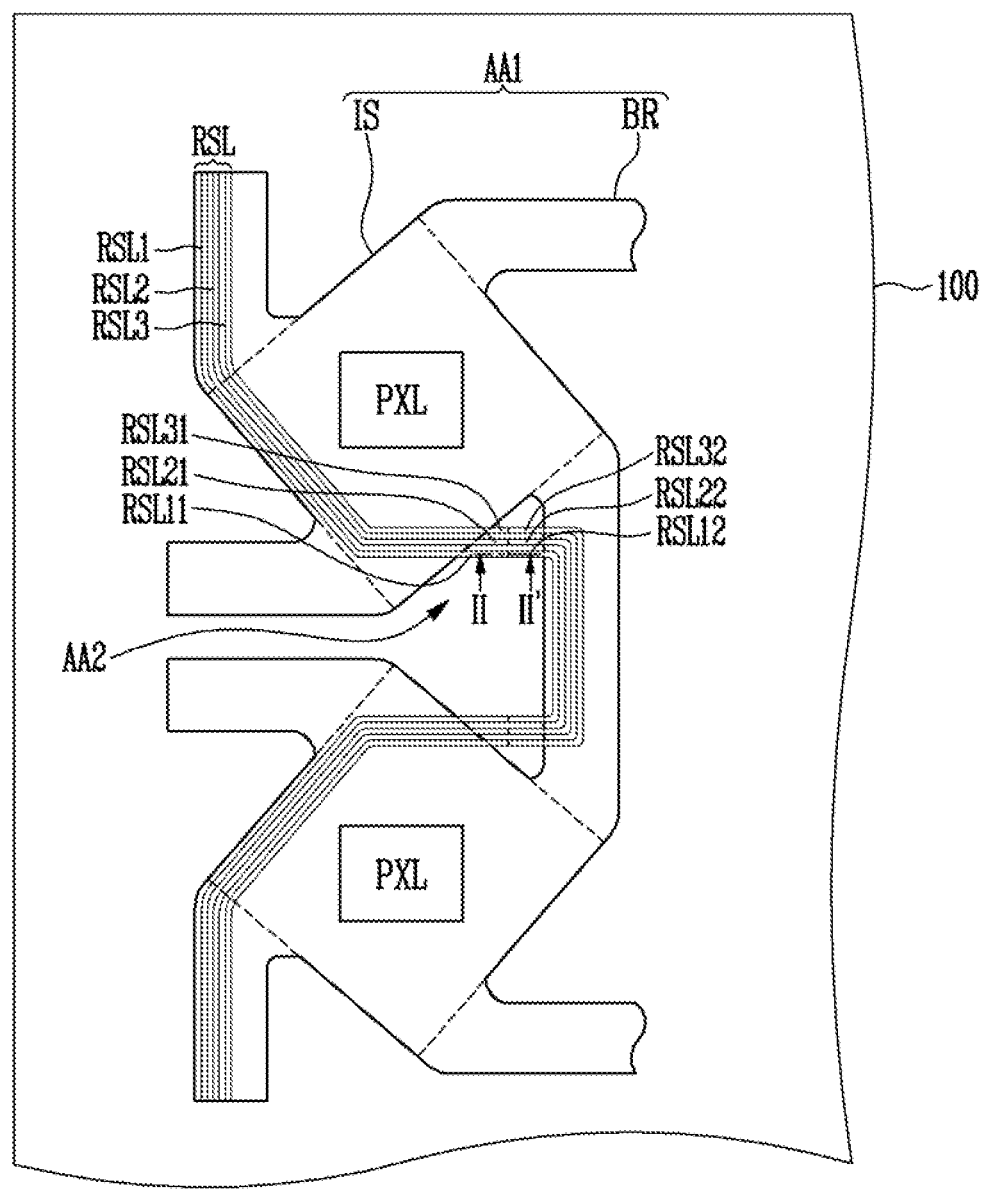
FIG. 8 is a plan view illustrating sensing lines in accordance with an embodiment of the present disclosure.
Figure 9:
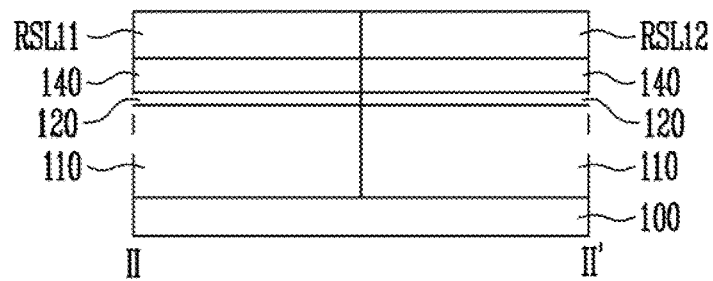
FIG. 9 is a sectional view taken along line II-II' of FIG. 8.

FIG. 8 is a plan diagram illustrating sensing lines RSL in accordance with an embodiment of the present disclosure. FIG. 9 is a sectional diagram taken along line II-II' of FIG. 8. For the sake of explanation, various lines coupled to the pixels PXL are omitted and only the sensing lines RSL are illustrated in FIGS. 8 and 9.

Referring to FIG. 8, the sensing lines RSL, pixels PXL and signal lines (e.g., data lines, scan lines, and power supply lines) coupled to the pixels PXL may be formed on the base layer 110.

The sensing lines RSL may include a first sensing line RSL1, a second sensing line RSL2, and a third sensing line RSL3.

The third sensing line RSL3 may be disposed closest to the pixel PXL, and the first sensing line RSL1 may be disposed farthest from the pixel PXL. The second sensing line RSL2 may be disposed between the first sensing line RSL1 and the third sensing line RSL3.

The sensing lines RSL may be disposed on the bridge patterns BR and the island patterns IS and extend in one direction.

The sensing lines RSL may include respective protrusions RSL11, RSL21, RSL31, RSL12, RSL22, and RSL32. The protrusions RSL11, RSL21, RSL31, RSL12, RSL22, and RSL32 may be parts of the sensing lines RSL. In detail, portions of the sensing lines RSL that protrude into the second area AA2 may form the respective protrusions RSL11, RSL21, RSL31, RSL12, RSL22, and RSL32.

The first protrusions RSL11 RSL21 and RSL31 may protrude from the island pattern IS into the second area AA2.

The second protrusions RSL12, RSL22, and RSL32 may protrude from the bridge pattern BR into the second area AA2. Particularly, the second protrusions RSL12. RSL22, and RSL32 may protrude from the second area AA2 toward the first protrusions RSL11, RSL21, and RSL31 so that the second protrusions RSL12, RSL22, and RSL32 can come into contact with the respective first protrusions RSL11, RSL21, and RSL31.

In the second area AA2, the protrusions RSL31 and RSL32 of the third sensing line RSL3 may be disposed between the protrusions RSL11, RSL12, RSL21 and RSL22 of the first and second sensing lines RSL1 and RSL2 and a junction between the corresponding island pattern IS and the associated bridge pattern BR. The sensing lines RSL may be provided on the first insulating layer 140.

The sensing lines RSL may be formed of the same material as that of electrodes/signal lines e.g., the gate line GL, and the gate electrodes GE1 and GE2) formed on the first insulating layer 140.

The sensing lines RSL may be formed simultaneously with the electrodes and signal lines on the first insulating layer 140.

Referring to FIG. 9, the base layer 110, the buffer layer 120, and the first insulating layer 140 may be provided in an area overlapping the protrusions RSL11, RSL21, RSL31, RSL12, RSL22, and RSL32 in the second area AA2. The base layer 110 may further include a pattern corresponding to the shape of the protrusions RSL11, RSL21, RSL31, RSL12, RSL22 and RSL32, as well as including the island patterns IS and the bridge patterns BR.

The sensing lines RSL may cone into contact with the data line DL through a contact hole formed in the second insulating layer 160. The contact hole may be formed in an area in which the sensing lines RSL and the data line DL overlap each other.

In FIG. 9, there is illustrated an example in which the sensing lines RSL are provided on the first insulting layer 140, but the present disclosure is not limited to this. For example, although not shown in FIG. 9, an additional insulating layer may be disposed between the first insulating layer 140 and the second insulating layer 160, and the sensing lines RSL may be provided on the additional insulating layer. Alternatively, an additional insulating layer may be disposed on the second insulating, layer 160, and the sensing lines RSL may be provided on the additional insulating layer.

In this case, the additional insulating layer may have a contact hole through which the sensing lines RSL are electrically connected with the data line DL.

Hereinbelow, a method of calculating a strain of the OLED device 1 using the sensing lines RSL to determine the degree of elongation of the OLED device will be described in detail.

Figure 10:
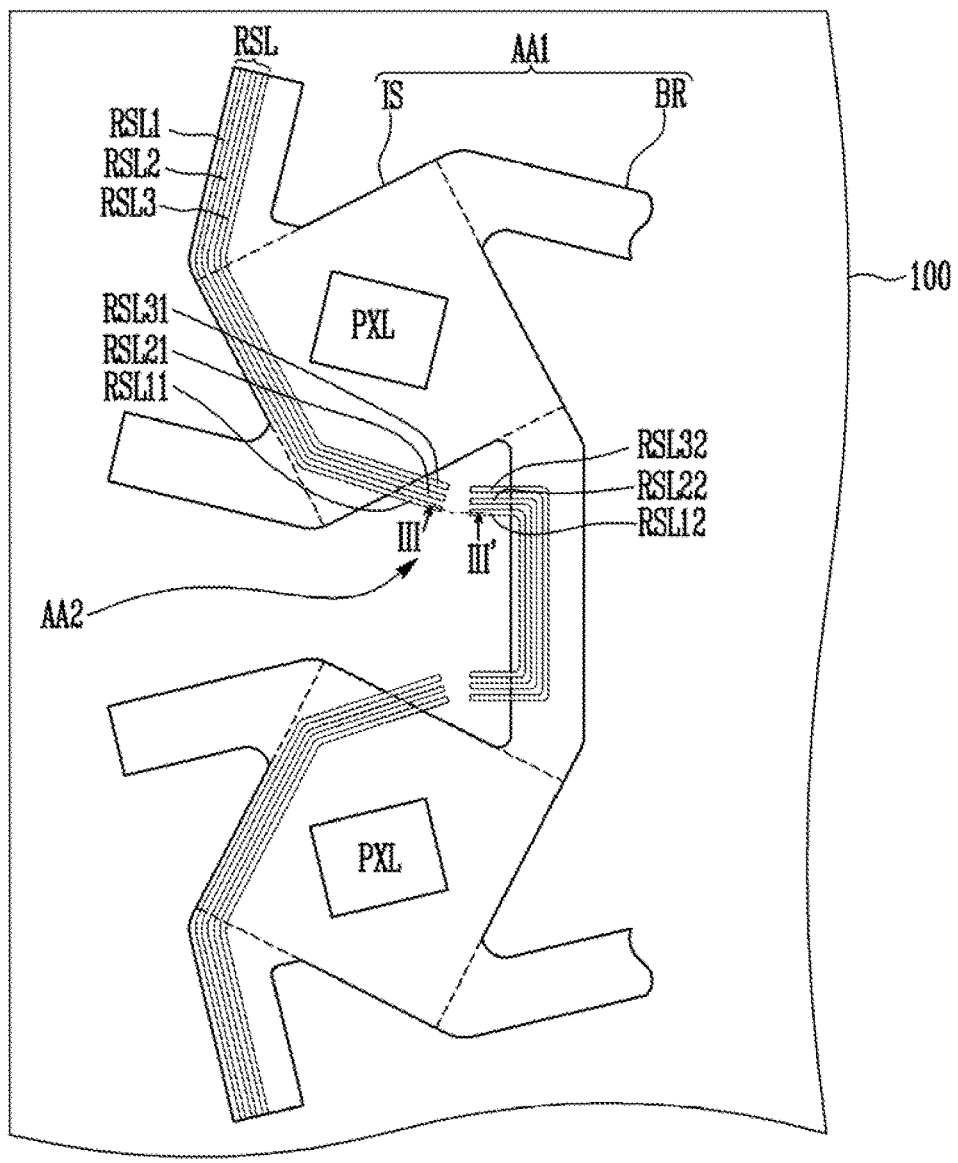
FIGS. 10 and 11 are diagrams illustrating sensing lines separated into pans when the OLED device is elongated, in accordance with an embodiment of the present disclosure.
Figure 11:
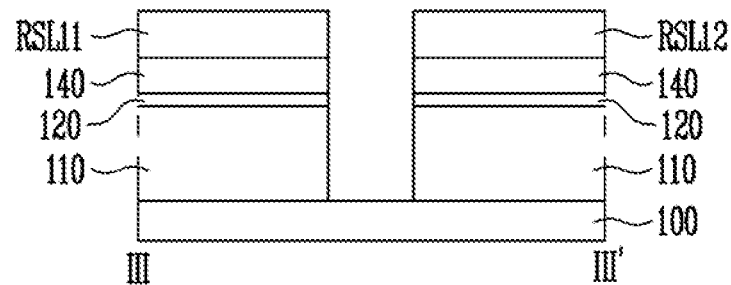

FIGS. 10 and 11 are diagrams illustrating sensing lines disconnected each other when the OLED device is elongated, in accordance with an embodiment of the present disclosure.

The sensing lines RSL in accordance with an embodiment of the present disclosure may be disconnected in the second area AA2. In other words, each of the sensing lines RSL may not be integrally formed.

Therefore, when the OLED device 1 is not elongated, the protrusions RSL11, RSL21, RSL31 RSL12, RSL22, and RSL32 make contact with each other so that they are electrically connected to each other.

Unlike this, if the OLED device 1 is elongated, the bridge pattern BR is also elongated. As a result, a position of the island pattern IS is changed. Thus, as shown in FIGS. 10 and 11, the protrusions RSL11, RSL21, RSL12, and RSL32 may be spaced apart from each other.

In this case, as shown in FIG. 11, the base layer 110, the buffer layer 120, and the first insulating layer 140 that are disposed under the protrusions RSL11, RSL21, RSL31, RSL12, RSL22, and RSL32 may be separated into pans, along with the protrusions RSL11, RSL21, RSL31, RSL12, RSL22, and RSL32.

However, the present disclosure is not limited to the embodiment of FIG. 11. For example, the base layer 110, the buffer layer 120, and the first insulating layer 140 may be only elongated without being separated into parts, and only the protrusions RSL11, RSL21, RSL31, RSL12, RSL22, and RSL32 may be separated into parts.

If the OLED device 1 begins to elongate, the protrusions RSL11 and RSL12 of the first sensing line RSL1 that are disposed farthest from the junction between the island pattern IS and the bridge pattern BR are first separated from each other. As the degree of elongation of the OLED device is increased, the protrusions RSL21, RSL31, RSL22, and RSL32 of the second and third sensing lines RSL2 and RSL3 may be successively separated from each other.

Depending on a strain of the OLED device 1, the number of separated sensing lines RSL may be changed.

The sensing unit 430 in accordance with an embodiment may sense current flowing through each data line DL during the second period.

As described above, the sensing lines RSL are connected to line corresponding data line DL through the contact hole.

The width of a line of the protrusions RSL11, RSL21, RSL31, RSL12, RSL22, and RSL32 in a connected state in which each of the protrusions RSL11, RSL21 and RSL31 are connected to respective protrusion RSL12, RSL22 and RSL32 may differ from the width of a line in a separated state in which each of the protrusions RSL11, RSL21 and RSL31 are disconnected to respective protrusion RSL12, RSL22 and RSL32. Hence, depending on the degree of elongation of the OLED device, the resistance of the sensing lines RSL may be changed.

Therefore, there are differences among current measured when all of the protrusions RSL11, RSL21, RSL31, RSL12, RSL22, and RSL32 are in the connected state, current measured when the protrusions RSL11 and RSL12 of the first sensing line RSL1 are separated and spaced apart from each other, current measured when the RSL11, RSL21, RSL12, and RSL22 of the first and second sensing lines RSL1 and RSL2 are separated and spaced apart from each other, and current measured when all of the protrusions RSL11, RSL21, RSL31, RSL12, RSL22, and RSL32 are separated and spaced apart from each other.

The sensing unit 430 may determine the degree of elongation of the OLED device, that is, the strain of the OLED device 1, with reference to the measured current.

The data compensation unit 440 in accordance with an embodiment may compensate for a dam signal to be supplied to each of the pixels PXL with reference to the strain of the OLED device 1 that is sensed by the sensing unit 430.

Particularly, the data compensation unit 440 may compensate for the data signal so that the brightness of an image can be increased. Furthermore, as the degree of elongation of the OLED device is increased, a of compensation may be increased.

The OLED device 1 in accordance with an embodiment of the present disclosure has an elongatable structure. When a portion of the OLED device 1 is elongated, the distance between pixels PXL disposed in the elongated area are increased. Hence, a density of pixels in the elongated area is reduced compared with that in a non-elongated area.

In this case, there may be a problem in that the image in the elongated area is dimly seen, compared with that of the non-elongated area.

However, in an embodiment of the present disclosure, if the OLED device 1 is elongated, the brightness of the corresponding pixels PXL may be increased by compensating for data voltages to be applied to the pixels PXL. Thereby, the above-mentioned problem may be solved.

In the foregoing embodiments, there has been illustrated an example in which three sensing lines RSL are coupled to each data line, but the present disclosure is not limited to this. The number of sensing lines RSL may be altered in various ways. The more the number of sensing lines RSL is, the higher the precision in determining the degree of elongation of the OLED device is.

Figure 12:
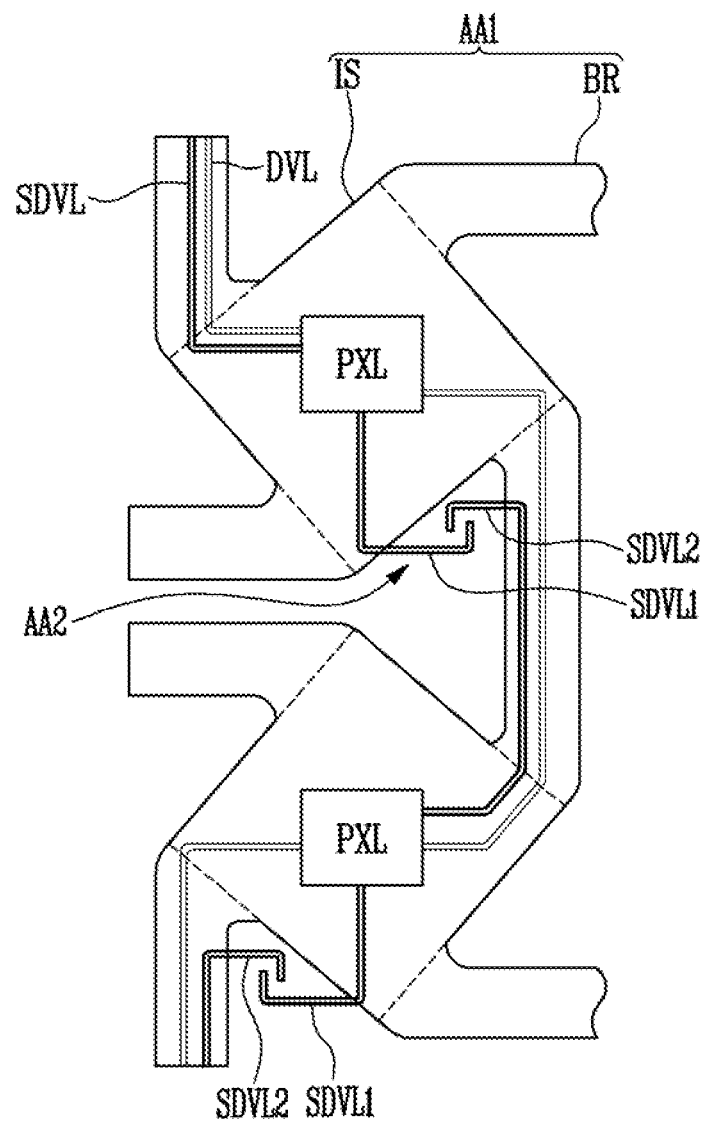
FIG. 12 is a plan view illustrating a sub-drive voltage line in accordance with an embodiment of the present disclosure.

FIG. 12 is a plan view illustrating a sub-drive voltage line in accordance with an embodiment of the present disclosure. In FIG. 12, for the sake of explanation, there are illustrated only the drive voltage line DVL and the sub-drive voltage line SDVL coupled to each pixel PXL among various lines included in the OLED device 1.

Referring to FIG. 12, the drive voltage line DVL may be provided on the bridge patterns BR and the island patterns IS of the base layer 110 and extend in one direction.

The drive voltage line DVL may provide the first power supply ELVDD to each pixel (PXL; particularly, the second transistor TR2 of FIG. 4 and the transistor TR5 of FIG. 5).

Here, the drive voltage line DVL is not separated into parts even when the OLED device 1 is elongated.

The sub-drive voltage line SDVL may also be provided on the bridge patterns BR and the island patterns IS of the base layer 110.

The sub-drive voltage line SDVL may include protrusions SDVL1 and SDVL2. The protrusions SDVL1 and SDVL2 are portions of the sub-drive voltage line SDVL. The parts of the sub-drive voltage line SDVL that protrude into the second area AA2 may form the respective protrusions SDVL1 and SDVL2.

The first protrusion SDVL1 may protrude from the corresponding island pattern IS toward the second area AA2. An end of each of the protrusions SDVL1 and SDVL2 may have a beat shape (e.g., an L shape).

Furthermore, the second protrusion SDVL2 may protrude from the corresponding bridge pattern BR toward the second area AA2, particularly, the first protrusion SDVL1.

Thus, the first protrusion SDVL1 and the second protrusion SDVL2 may be disposed to face each other in the second area AA2.

The sub-drive voltage line SDVL may be provided on the same layer as the drive voltage line DVL. In other words, the sub-drive voltage line SDVL may be provided on the second insulating layer 160.

The sub-drive voltage line SDVL may be formed of the same material as that of electrodes/signal lines (e.g., the source electrodes and the drain electrodes of the transistors, the drive voltage line, and the capacitor electrodes) formed on the second insulating layer 160.

The sub-drive voltage line SDVL may be formed simultaneously with the electrodes/signal lines provided on the second insulating layer 160. When the OLED device 1 is not elongated, the first protrusion SDVL1 and the second protrusion SDVL2 may be spaced apart from each other.

When the OLED device 1 is elongated, the first protrusion SDVL1 and the second protrusion SDVL2 may come into contact with each other.

Figure 13:
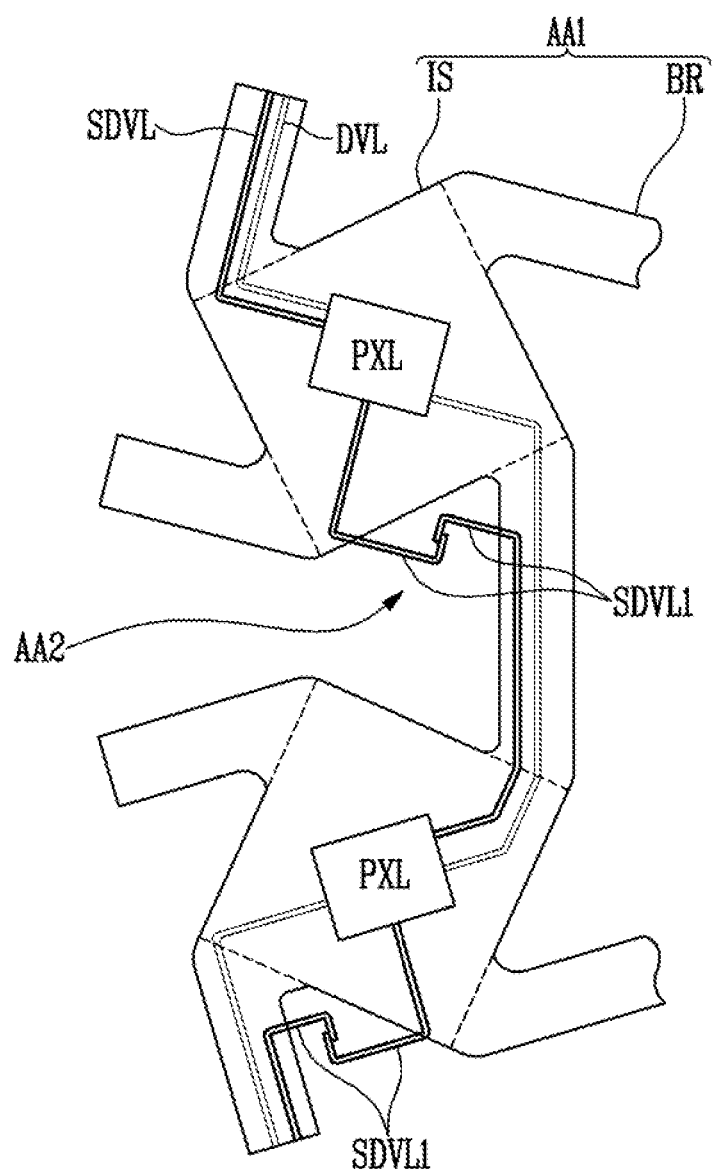
FIG. 13 is a diagram illustrating protrusions coming into contact with each other when the OLED device is elongated, in accordance with an embodiment of the present disclosure.

FIG. 13 is a diagram illustrating the protrusions coming into contact with each other when the OLED device is elongated, in accordance with an embodiment of the present disclosure.

When the OLED device 1 is elongated, the bridge pattern BR may stretch and a position of the island pattern IS may be changed. Hence, as shown in FIG. 13, the first protrusion SDVL1 and the second protrusion SDVL2 that have been spaced apart from each other may come into contact with each other.

When the first protrusion SDVL1 and the second protrusion SDVL2 are spaced apart from each other, the first power supply ELVDD cannot be applied to the corresponding pixel PXL through the sub-drive voltage line SDVL.

In contrast, when the first protrusion SDVL1 and the second protrusion SDVL2 are brought into contact with each other, the first power supply ELVDD may be applied to the corresponding pixel PXL through the sub-drive voltage line SDVL.

Consequently, when the OLED device 1 is elongated, each pixel PXL may receive the first power supply ELVDD through both the drive voltage line DVL and the sub-drive voltage line SDVL.

The OLED device 1 in accordance with an embodiment of the present disclosure may have an elongatable structure. If the OLED device 1 is elongated, the drive voltage line DVL may stretch, thus causing an increase in resistance of the drive voltage line DVL.

If the resistance of the drive voltage line DVL increases, a sufficient amount of first power supply ELVDD may not be applied to pixels PXL which are disposed away from a power source for the first power supply ELVDD. Consequently, there may be a problem of a reduction in uniformity of brightness.

However, in accordance with an embodiment of the present disclosure, when the OLED device 1 is elongated, the first power supply ELVDD can be supplied, to the pixels PXL through both the drive voltage line DVL and the sub-drive voltage line SDVL. Therefore, the foregoing problem can be solved.

Figure 14:
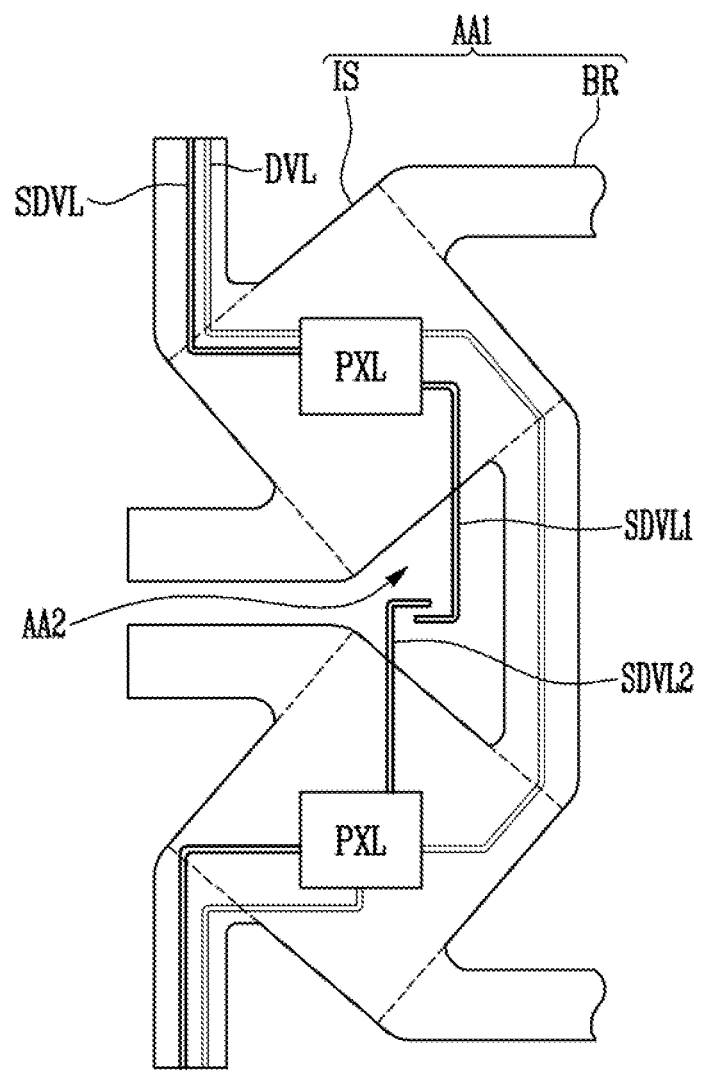
FIG. 14 is a plan view illustrating a sub-drive voltage line in accordance with an embodiment of the present disclosure.

FIG. 14 is a plan view illustrating a sub-drive voltage line in accordance with an embodiment of the present disclosure.

Referring to FIG. 14, the sub-drive voltage line SDVL may include protrusions SDVL1 and SDVL2. The first protrusion SDVL1 may protrude from an island pattern IS toward the second area AA2.

An end of each of the protrusions SDVL1 and SDVL2 may have a lent shape (e.g., an L shape).

The second protrusion SDVL2 may protrude toward the second area AA2 from another island pattern IS different from the island pattern IS provided with the first protrusion SDVL1. Particularly, the second protrusion SDVL2 may protrude toward the first protrusion SDVL1.

Thus, the first protrusion SDVL1 and the second protrusion SDVL2 may be disposed to face each other in the second area AA2.

Figure 15:
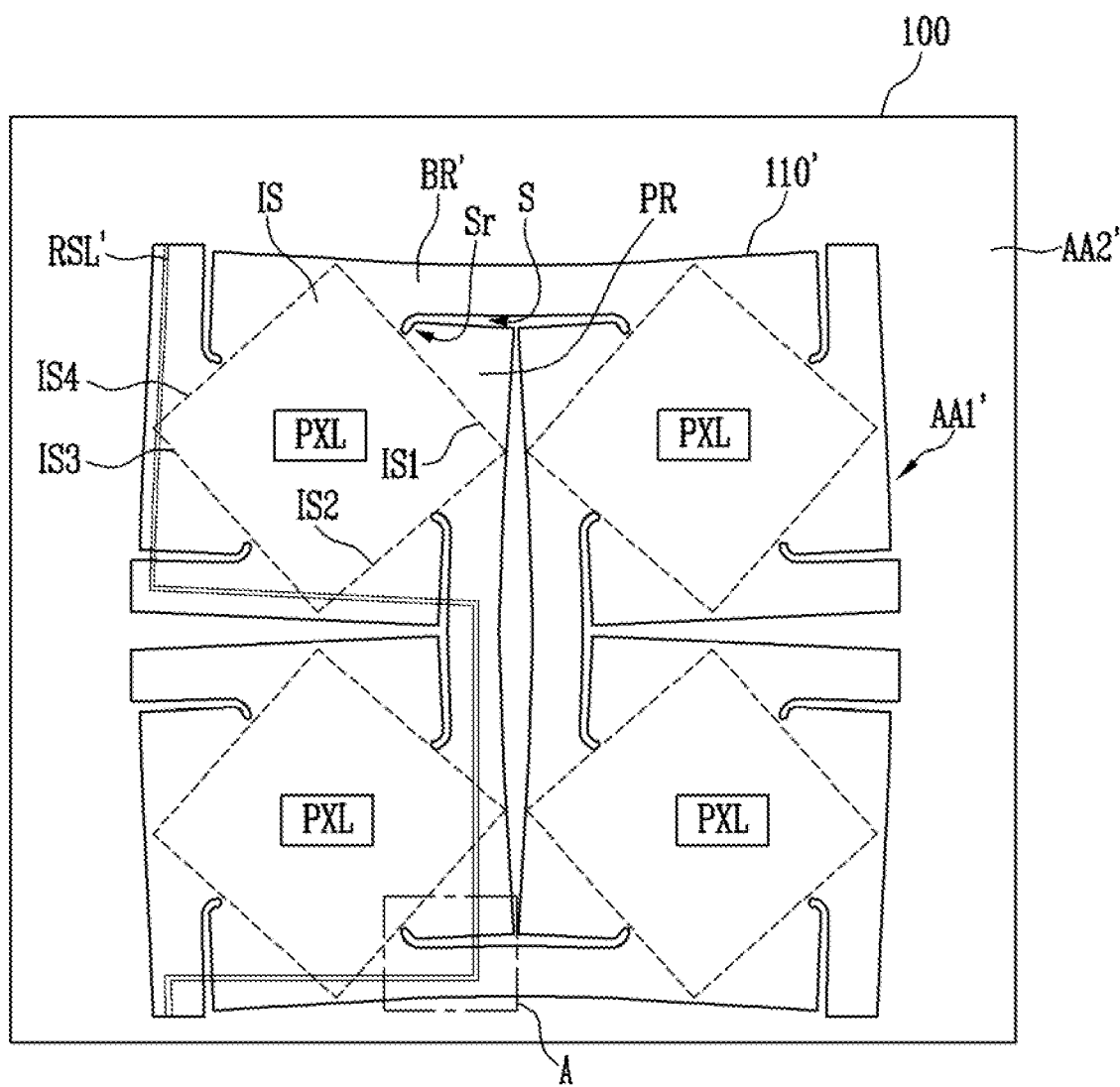
FIG. 15 is a plan view illustrating a base layer of an OLED device in accordance with an embodiment of the present disclosure.

FIG. 15 is a plan view illustrating a base layer of an OLED device in accordance with an embodiment of the present disclosure. FIG. 15 illustrates only four island patterns IS, but the number of island patterns IS disposed on the substrate 100 may be altered in various ways. For the sake of explanation, various lines coupled to the pixels PXL are omitted and only a sensing line RSL' are illustrated in FIG. 15.

The illustration of other elements except the base layer 110' is the same as that described with reference to FIGS. 1 to 14; therefore, detailed explanation thereof will be omitted.

Referring to FIG. 15 the base layer 110' in accordance with an embodiment of the present disclosure may be provided on a substrate 100 and have an island shape.

In detail, a plurality of island patterns IS may be regularly arranged in first axis (X-axis) and second axis (Y-axis) directions.

The above-mentioned pixel PXL may be provided on each island pattern IS. Each island pattern IS may be provided with a single pixel PXL or a plurality of pixels PXL.

The island pattern IS may be enclosed by first to fourth sides IS1 to IS4. A bridge pattern BR' and a peripheral area PR may be disposed on each side IS1 to IS4 of the island pattern IS.

The bridge pattern BR' couples adjacent island patterns IS to each oilier. Lines for supplying power, data signals, scan signals, etc. to the corresponding pixels PXL may be formed on each bridge pattern BR'.

The substrate 100 may include a first area AA1' and a second area AA2'.

The island patterns IS, the bridge patterns BR' and the peripheral areas PR may be provided on the first area AA1'. The island patterns IS, the bridge patterns BR' and the peripheral areas PR may be provided on the first area AA1'.

The second area AA2' may be a peripheral area of the first area AA1', be formed outside the first area AA1', and have a shape in which it enclose the perimeter of the first area AA1'. The base layer 110' may not be provided on the second area AA2' other than an area overlapping the sensing line RSL', which will be described in more detail later herein.

When the substrate 100 is elongated or contracted, the distance between the island patterns IS may be increased or reduced. In this case, the shapes of the respective island patterns IS may not be deformed. That is, each island pattern IS may not be increased or reduced in width and height.

Hence, the structure of the pixel PXL formed on the island pattern IS may also not be deformed.

However, when the substrate 100 is elongated, the bridge patterns BR' coupling the island patterns IS with each other may be deformed.

A slit S may be formed between the bridge pattern BR' and the peripheral area PR which are disposed on each of the sides IS1 to IS4 of the island pattern IS. The slit S may have a curved part Sr on an end thereof.

The elongation of the base layer 110' may be controlled by adjusting the thickness of the bridge pattern BR', the length and the width of the slit S, etc.

The sensing line RSL may be disposed on the bridge patterns BR', the island patterns IS and the peripheral areas PR, and extend in a certain direction.

The sensing line RSL' may include a first protrusion RSL11' and a second protrusion RSL12'. The first protrusion RSL11' and the second protrusion RSL12' may be parts of the sensing line RSL'. Portions of the sensing line RSL' that protrude into the second area AA2' may form the first protrusion RSL11' and the second protrusion RSL12'. Thus, the first protrusion RSL11' and the second protrusion RSL12' may be disposed in the second area AA2'.

Although FIG. 15 illustrates only the single sensing line RSL', the present disclosure is not limited to this. The number of sensing lines RSL' may be altered in various ways.

Figure 16A:
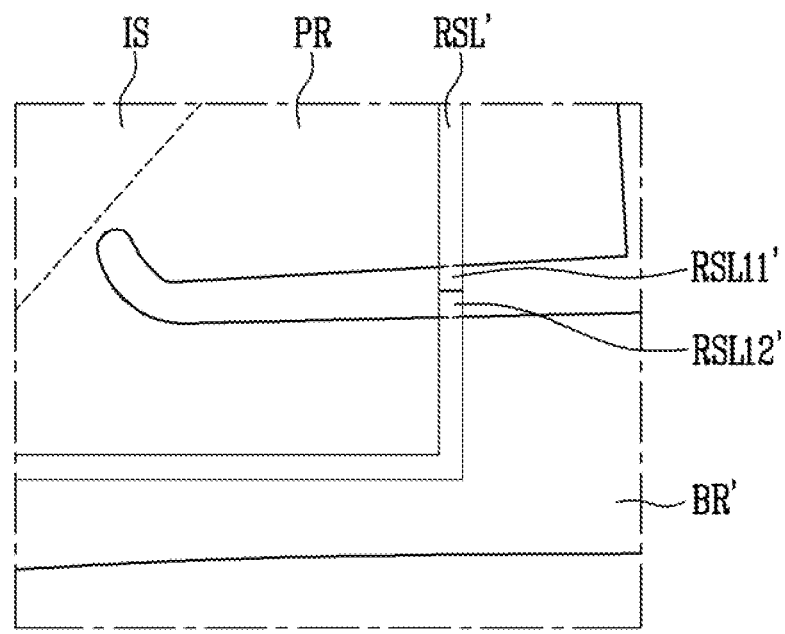
FIGS. 16A and 16B are enlarged diagrams of portion A of FIG. 15.
Figure 16B:
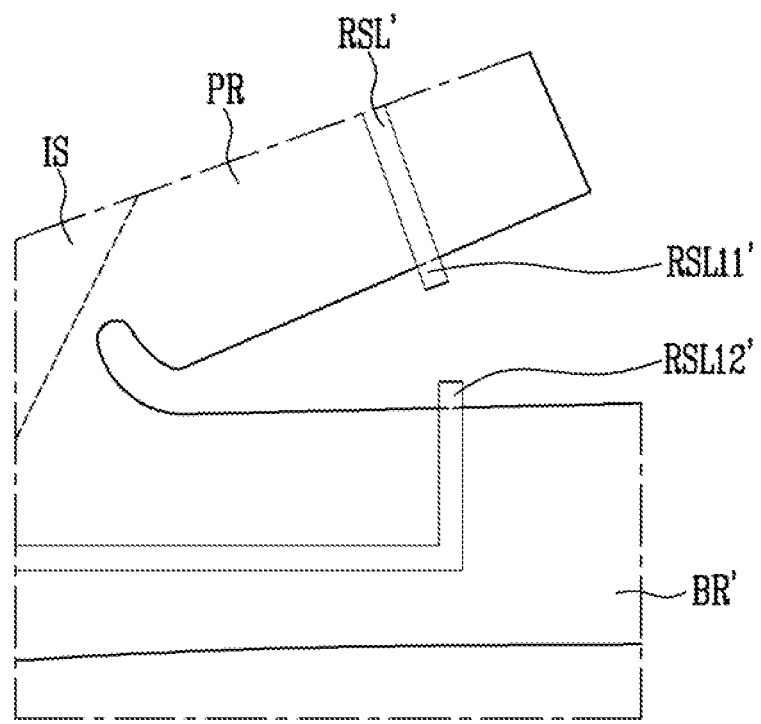

FIGS. 16A and 16B are enlarged diagrams of portion A of FIG. 15. FIG. 16A is a diagram illustrating the case where the substrate is not elongated. FIG. 16B is a diagram illustrating the case where the substrate is elongated.

Referring to FIG. 16A, when the substrate 100 is not elongated, the first protrusion RSL11' and the second protrusion RSL12' may be in contact with each other.

Referring, to FIG. 16B, when the substrate 100 is elongated, the distance between each bridge BR' and the corresponding adjacent peripheral area PR may be increased, whereby the first protrusion RSL11' and the second protrusion RSL12' may be moved and spaced apart from each other.

Although not shown in FIG. 15, a sub-drive voltage line SDVL in lieu of the sensing line RSL may be provided on the base layer 110'.

Various embodiments of the present disclosure provide a display device capable of displaying an image with uniform brightness even when it is elongated.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising:
a substrate including a pixel area, and a peripheral area surrounding the pixel area, the pixel area including a first area and a second area surrounding the first area;
a base layer disposed on the pixel area, comprising a plurality of island patterns on which respective pixels are provided, and comprising a plurality of bridge patterns coupling the adjacent ones of the island patterns to each other, wherein the plurality of island patterns and the plurality of bridge patterns are disposed on the first area; and
conductive lines comprising a plurality of first protrusions and a plurality of second protrusions, wherein the plurality of first protrusions and the plurality of second protrusions protrude toward from the base layer into the second area.

2. The display device of claim 1, wherein signal lines coupled to the pixels are provided on the plurality of bridge patterns.

3. The display device of claim 1,
wherein each of the plurality of island patterns has a rectangular shape, and
wherein respective sides of the plurality of island patterns are coupled with a plurality of corresponding bridge patterns.

4. The display device of claim 1,
wherein the conductive lines comprise sensing lines provided on the base layer and configured to measure a degree of elongation of the substrate.

5. The display device of claim 4, wherein the plurality of first protrusions and the plurality of second protrusions are included in the sensing lines.

6. The display device of claim 5,
wherein, when the substrate is not elongated, the plurality of first protrusions and the plurality of second protrusions come into contact with each other, and
wherein, when the substrate is elongated, the plurality of first protrusions and the plurality of second protrusions are spaced apart from each other.

7. The display device of claim 5,
wherein the plurality of first protrusions protrude from one side of each of the plurality of island patterns, and
wherein the plurality of second protrusions protrude from one side of the plurality of corresponding bridge pattern so that the plurality of second protrusions are connected with the plurality of first protrusions in the second area.

8. The display device of claim 7,
wherein each of the plurality of first protrusions and the plurality of second protrusions comprise a plurality of first sub-protrusions and a plurality of second sub-protrusions provided between each of the plurality of island patterns and the plurality of corresponding bridge pattern coupled with the plurality of island patterns, and
wherein, as the degree of elongation of the substrate is increased, the numbers of the plurality of first sub-protrusions and the plurality of second sub-protrusions in contact with each other are reduced.

9. The display device of claim 5, further comprising:
a scan driver configured to supply a scan signal to the pixels through scan lines;
a data driver configured to supply a data signal to the pixels through data lines;
a sensing unit configured to measuring the degree of elongation of the substrate with reference to variation in resistance of the sensing lines; and
a data compensation unit configured to compensate for the data signal with reference to the degree of elongation of the substrate.

10. The display device of claim 9, wherein the sensing lines come into contact with the data lines.

11. The display device of claim 10,
wherein the data driver supplies the data signal for displaying an image to the data lines during a first period, and
wherein the data driver supplies a reference data signal to the data lines during a second period, the reference data signal being provided for measuring the degree of elongation of the substrate.

12. The display device of claim 11, wherein the sensing unit senses current flowing through the data lines during the second period.

13. The display device of claim 1,
wherein the conductive lines comprise a drive voltage line and a sub-drive voltage line configured to supply a first power supply to the pixels.

14. The display device of claim 13, wherein the plurality of first protrusions and the plurality of second protrusions are included in the sub-drive voltage line.

15. The display device of claim 14,
wherein, when the substrate is not elongated, the plurality of first protrusions and the plurality of second protrusions are spaced apart from each other, and
wherein, when the substrate is elongated, the plurality of first protrusions and the plurality of second protrusions come into contact with each other.

16. The display device of claim 15, wherein, when the substrate is elongated, the first power supply is supplied to the pixels through the drive voltage line and the sub-drive voltage line.

17. The display device of claim 14,
wherein the plurality of first protrusions protrude from one side of each of the plurality of island patterns, and
wherein the plurality of second protrusions protrude from one side of the plurality of corresponding bridge patterns so that the plurality of second protrusions are connected with the plurality of first protrusions in the second area.

18. The display device of claim 14,
wherein each of the plurality of first protrusions protrudes from one side of each of the plurality of island patterns, and
wherein each of the plurality of second protrusions protrudes from one side of another island pattern adjacent to the island pattern from which the each of the plurality of first protrusion protrudes.

19. The display device of claim 14, further comprising:
a first insulating layer provided on the base layer; and
a second insulating layer provided on the first insulating layer.

20. The display device of claim 19, wherein the drive voltage line is provided on the second insulating layer.

21. The display device of claim 19, wherein each of the pixels comprises a transistor and the transistor comprises:
a gate electrode provided on the first insulating layer; and
a source electrode and a drain electrode provided on the second insulating layer.

22. The display device of claim 19, wherein the plurality of first protrusions and the plurality of second protrusions are provided on the second insulating layer.

23. The display device of claim 19, wherein the drive voltage line and the sub-drive voltage line are provided on an identical layer.

24. A method of driving a display device, including a substrate and pixels disposed on the substrate, the method comprising:
supplying a reference data signal to data lines;
calculating a degree of elongation of the substrate with reference to current flowing through the data lines;
generating a compensated data signal by compensating for a data signal for displaying an image with reference to the degree of elongation of the substrate; and
supplying the compensated data signal to the pixels through the data lines.

25. The method of claim 24,
wherein sensing lines including a first protrusion and a second protrusion are coupled to the data lines, and
wherein, when the substrate is not elongated, the first protrusion and the second protrusion come into contact with each other, and when the substrate is elongated, the first protrusion and the second protrusion are spaced apart from each other.

26. The method of claim 25, wherein, as the degree of elongation of the substrate is increased, resistance of the sensing lines is increased.

27. The method of claim 24, wherein the data signal is compensated so that brightness of the pixels when the substrate is elongated is higher than that when the substrate is not elongated.

* * * * *